US008980446B2

(12) United States Patent
Engelhart et al.

(10) Patent No.: US 8,980,446 B2
(45) Date of Patent: Mar. 17, 2015

(54) PVD HYBRID METHOD FOR DEPOSITING MIXED CRYSTAL LAYERS

(75) Inventors: Wolfgang Engelhart, Metzingen (DE); Veit Schier, Leinfelden-Echterdingen (DE)

(73) Assignee: Walter AG, Tübingen (DE)

( * ) Notice: Subject to any disclaimer, the term of this patent is extended or adjusted under 35 U.S.C. 154(b) by 172 days.

(21) Appl. No.: 13/642,976

(22) PCT Filed: May 3, 2011

(86) PCT No.: PCT/EP2011/057064
§ 371 (c)(1), (2), (4) Date: Jan. 7, 2013

(87) PCT Pub. No.: WO2011/138331
PCT Pub. Date: Nov. 10, 2011

(65) Prior Publication Data

US 2013/0209834 A1 Aug. 15, 2013

(30) Foreign Application Priority Data

May 4, 2010 (DE) ........................ 10 2010 028 558

(51) Int. Cl.

| | |
|---|---|
| ***C23C 14/00*** | (2006.01) |
| ***C23C 14/32*** | (2006.01) |
| ***C23C 14/08*** | (2006.01) |
| ***C23C 14/22*** | (2006.01) |
| ***C23C 14/35*** | (2006.01) |
| ***C23C 28/04*** | (2006.01) |
| ***C23C 30/00*** | (2006.01) |
| ***B32B 15/01*** | (2006.01) |

(52) U.S. Cl.
CPC ............... *C23C 14/325* (2013.01); *C23C 14/08* (2013.01); *C23C 14/22* (2013.01); *C23C 14/352* (2013.01); *C23C 28/042* (2013.01); *C23C 28/044* (2013.01); *C23C 30/005* (2013.01); *B32B 15/01* (2013.01); *B32B 15/012* (2013.01); *B32B 15/013* (2013.01); *C23C 14/35* (2013.01)
USPC ............ 428/701; 51/307; 51/309; 204/192.1; 204/192.15; 204/192.16; 428/697; 428/698; 428/699; 428/702

(58) Field of Classification Search
CPC ........ C23C 14/06; C23C 14/22; C23C 14/24; C23C 14/32; C23C 14/34; C23C 14/35; B23B 27/14; B32B 15/01
USPC ............ 51/307, 309; 428/697, 698, 699, 701, 428/702; 204/192.1, 192.15, 192.16
See application file for complete search history.

(56) References Cited

U.S. PATENT DOCUMENTS

| | | | | |
|---|---|---|---|---|
| 4,877,505 | A * | 10/1989 | Bergmann | 204/192.15 |
| 6,033,734 | A * | 3/2000 | Muenz et al. | 204/192.16 |
| 6,767,658 | B2 * | 7/2004 | Yamamoto et al. | 51/307 |
| 8,152,971 | B2 * | 4/2012 | Quinto et al. | 204/192.16 |
| 8,409,731 | B2 * | 4/2013 | Johansson et al. | 428/697 |
| 8,652,589 | B2 * | 2/2014 | Ramm | 204/192.15 |
| 2005/0029692 | A1 | 2/2005 | Abe et al. | |
| 2005/0284747 | A1 | 12/2005 | Kubota | |
| 2009/0078565 | A1 | 3/2009 | Rodmar et al. | |

FOREIGN PATENT DOCUMENTS

| | | | |
|---|---|---|---|
| CN | 1243786 | | 3/2006 |
| CN | 101368260 | | 2/2009 |
| DE | 43 31 890 | | 3/1995 |
| DE | 44 05 477 | | 8/1995 |
| EP | 0 306 612 | | 3/1989 |
| EP | 0 965 611 | | 12/1999 |
| EP | 2 037 000 | | 3/2009 |
| JP | 2002-053946 | * | 2/2002 |
| JP | 2006-249506 | | 9/2006 |
| JP | 2009-068110 | | 4/2009 |
| WO | 2004/026792 | | 4/2004 |
| WO | 2008/138789 | | 11/2008 |
| WO | 2009/110830 | | 9/2009 |

OTHER PUBLICATIONS

Ramm et al "Thermal Stability of Thin Film Corundum-Type Solid Solutions of (Al(1-x)Cr(x))203 Synthesized Under Low-Temperature Non-Equilibrium Conditions" Advanced Eng. mat. 9 No. 7 (2007) p. 604-608.*

Witthaut et al "Preparation of Cr2O3-Al2O3 Solid Solutions by Reactive Magnetron Sputtering" Mikochimica Acta 133, (2000) p. 191-196.*

(Continued)

*Primary Examiner* — Archene Turner
(74) *Attorney, Agent, or Firm* — Morgan, Lewis & Bockius LLP

(57) ABSTRACT

The present invention concerns a method for depositing mixed crystal layers with at least two different metals on a substrate by means of PVD methods. To provide a method of depositing mixed crystal layers with at least two different metals on a substrate by means of PVD methods, which gives mixed crystal layers which are as free as possible of macroparticles (droplets) and which have a proportion as high as possible of a desired crystalline phase and which are highly crystalline, it is proposed according to the invention that deposition of the mixed crystal layer is effected with simultaneous application of i) the cathode sputtering method of dual magnetron sputtering or high power impulse magnetron sputtering and ii) arc vapour deposition.

14 Claims, No Drawings

(56) References Cited

OTHER PUBLICATIONS

Chinese Office Action dated Dec. 23, 2013 for CN Application No. 201180022438.4.

Ramm, et al., Pulse Enhanced Electron Emission (P3e(TM)) Arc Evaporation and the Synthesis of Wear Resistant Al—Cr—O Coatings in Corundum Structure, Surface & Coatings Technology, 202, pp. 876-883, 2007.

Diechle et al., Combinatorial Approach to the Growth of alpha-(Al1-x, Crx)2O3 Solid Solution Strengthened Thin Films by Reactive R.F. Magnetron Sputtering, Coatings Technology, 204, pp. 3258-3264, 2010.

Yoon et al., Syntheses and properties of Cr—Al—Mo—N Coatings Fabricated by Using a Hybrid Coating System, Journal of the Korean Physical Society, 54, pp. 1237-1241, Mar. 2009.

International Search Report for PCT/EP2011/057064 dated Oct. 17, 2012.

German Search Report for Application No. 10 2010 028 558.7 dated Nov. 17, 2011.

English Translation of the International Preliminary Report on Patentability for International Application No. PCT/ EP2011/057064 dated Jan. 24, 2013.

Notice of Reasons for Rejection (with English Translation) for Japanese Application 2013-508479 dated Jun. 17, 2014.

* cited by examiner

PVD HYBRID METHOD FOR DEPOSITING MIXED CRYSTAL LAYERS

The present invention concerns a method for depositing mixed crystal layers with at least two metals (M1, M2) on a substrate by means of PVD methods.

STATE OF THE ART

Cutting tools which are used for example for cutting metal machining generally comprise a main body (substrate) of hard metal, cermet, steel or high-speed steel with a wear-resistant single-layer or multi-layer coating of metallic hard material layers, oxide layers and the like. CVD methods (chemical gas phase deposition) and/or PVD methods (physical gas phase deposition) are used for applying such coatings. In the case of the PVD methods a distinction is drawn between different variants, for example cathode sputtering (sputter deposition), arc vapour deposition (arc PVD), ion plating, electron beam deposition and laser ablation. Cathode sputtering, like magnetron sputtering, reactive magnetron sputtering or high power impulse magnetron sputtering (HIPIMS) and arc vapour deposition count among the PVD methods most frequently used for coating cutting tools.

In the sputtering operation (cathode sputtering), atoms or molecules are detached from the target by bombardment with high-energy ions and converted into the gaseous phase where they are then deposited on the substrate either directly or after reaction with a reaction gas. In the case of arc vapour deposition an arc burns between the chamber and the target, and melts and vaporises the target material. In that case a large part of the vaporised material is ionised and accelerated towards the substrate which is at a negative potential and is deposited on the substrate surface.

Metal oxide layers can be deposited on a substrate both by magnetron sputtering and also by arc vapour deposition. Usually higher deposition rates are achieved with arc vapour deposition. The variants of single and dual magnetron sputterings suffer from the disadvantage that many oxides cannot be achieved or at most can be partially achieved in the particularly stable and therefore desired alpha phase, such as for example in the case of aluminium oxide or in the case of aluminium-chromium mixed oxide. When using arc vapour deposition it is possible to achieve a very high proportion of alpha phase of the metal oxides. It will be noted however that a disadvantage of arc vapour deposition is that, due to the method involved, very many macroparticles (droplets) are also deposited, and the avoidance thereof is extremely complicated and expensive. Because of deposition in the form of unstable phases or mixed phases and/or deposition with very many macroparticles the layers deposited in accordance with the above-mentioned methods frequently do not have sufficiently great hardness and low thermal conductivity for certain applications in respect of which those properties are required.

DE 44 05 477 and DE 43 31 890 describe the production of nitride layers, in which the deposition of a base material is started by means of unbalanced magnetron sputtering (single magnetron sputtering). Then in the later course of layer deposition cathodic arc discharge is switched on to incorporate additional metals (incorporation material) in the layer of the deposited base material. That gives a multi-layer coating, in which respect it is to be assumed that multi-phase layers are produced by virtue of the low levels of plasma energy in the case of unbalanced magnetron sputtering.

US 2005/0284747 describes the production of silicon-bearing multi-layer coatings by means of magnetron sputtering and arc vapour deposition, wherein the coatings have a multi-phase structure with alpha silicon nitride and beta silicon nitride. No mixed crystal structure is achieved. Aluminium and alloys thereof are deposited in the arc, and that leads to the formation of macroparticles (droplets).

EP 0 306 612 describes the production of coatings on substrates by means of cathode sputtering and arc vapour deposition to achieve layers which are denser and more compact in comparison with pure cathode sputtering. The deposited layers generally have mixed phases and many macroparticles, which is a disadvantage.

OBJECT

The object of the present invention was to provide a method for depositing mixed crystal layers with at least two different metals on a substrate by means of PVD methods, with which there are obtained mixed crystal layers which are free as possible of macroparticles (droplets) and which have a proportion as high as possible of a desired crystalline phase, in particular single-phase mixed crystal layers, and which are highly crystalline.

DESCRIPTION OF THE INVENTION

According to the invention that object is attained by a method of the kind set forth in the opening part of this specification, in which deposition of the mixed crystal layer is effected with simultaneous application of i) the cathode sputtering method of dual magnetron sputtering or high power impulse magnetron sputtering (HIPIMS) and ii) arc vapour deposition (arc PVD).

The simultaneous application according to the invention of dual magnetron sputtering or HIPIMS and arc vapour deposition makes it possible to advantageously produce highly crystalline single-phase mixed crystal layers which are substantially free of macroparticles (droplets), but which at least have a markedly lower number of macroparticles than layers produced in accordance with known methods. It is assumed that the substantially single-layer mixed crystal structure is produced by virtue of the plasma energies which are markedly higher in dual magnetron sputtering or HIPIMS than in the case of single magnetron sputtering. That was surprising. At the same time the layers produced according to the invention are distinguished by advantageous hardness and thermal conductivity by virtue of their particular structural properties.

Mixed crystal layers which are particularly preferred according to the invention are layers of single-phase mixed crystals of aluminium chromium oxide $(AlCr)_2O_3$. Layers of that composition can be deposited both by arc vapour deposition and also by single or dual magnetron sputtering from for example an AlCr(70/30) at % target. Admittedly, with PVD deposition by arc vapour deposition alone, a high proportion of the thermodynamically stable alpha phase of the mixed crystal is obtained, but at the same time also a very high proportion of macroparticles (droplets) which are also deposited and which considerably worsen the quality of the mixed crystal layer. Admittedly, in deposition by magnetron sputtering, the number of macroparticles (droplets) which are also deposited is reduced in comparison with arc vapour deposition, but a thermodynamically stable alpha phase of the mixed crystal is scarcely achieved. It was now surprisingly possible to demonstrate that the method according to the invention which uses the simultaneous application of dual magnetron sputtering or HIPIMS and arc vapour deposition makes it possible to deposit mixed crystal layers which at the same time contain highly crystalline mixed crystal layers which are almost free of macroparticles (droplets) and which are single-phase or at least have a very high proportion of a desired phase, for example stable alpha phase in the case of aluminium chromium oxide, and at most small proportions of further phases, for example gamma phase in the case of aluminium chromium oxide. The application of single magnetron sputtering and arc vapour deposition, as is also described in the state of the art, does not lead to the desired result.

In the method according to the invention at least two different targets are used, namely a target with at least one first metal (M1) as the cathode in the arc vapour deposition method and a further target with at least one further metal for cathode sputtering in the dual magnetron sputtering method or HIPIMS.

The targets used can be the pure metals, for example pure aluminium targets or chromium targets, or mixed metal targets, such as for example aluminium/chromium(70/30) at % targets. Alternatively it is also possible to use ceramic targets which already contain the compounds to be deposited, for example metal oxides, metal nitrides, metal carbides or metal borides. Desirably the higher-melting target material is used in the arc vapour deposition method and the lower-melting target material is used in the dual magnetron method or HIPIMS. An example which is advantageous according to the invention is the use of a metallic chromium target in the arc vapour deposition method and a metallic aluminium target in the dual magnetron method or HIPIMS. If the above-mentioned targets are used conversely, that gives a higher deposition of macroparticles (droplets) and a lower degree of crystallinity in respect of the mixed crystal layers.

In an embodiment of the method according to the invention the mixed crystal layers are single-phase or substantially single-phase mixed crystal layers of mixed oxides, carbides, nitrides, carbonitrides, oxynitrides, oxycarbides, oxycarbonitrides, borides, boronitrides, borocarbides, borocarbonitrides, borooxynitrides, borooxocarbides, borooxocarbonitrides and oxoboronitrides of the at least two different metals (M1, M2). Preferably however the mixed crystal layers comprise mixed oxides of the at least two different metals (M1, M2). A quite particularly preferred system is mixed crystal layers of aluminium chromium oxide.

Dual magnetron sputtering and high power impulse magnetron sputtering (HIPIMS) are suitable for the method according to the invention. Reactive dual magnetron sputtering is quite particularly preferred, for example using purely metallic targets and oxygen as the reactive gas.

In a further embodiment of the invention at least one target which contains at least the first metal (M1) is used for application of the dual magnetron method or HIPIMS. Alternatively however it is also possible to use mixed metallic targets for application of the dual magnetron method or HIPIMS, which targets contain both the first metal (M1) and also the second metal (M2) and optionally further metals. An example of a mixed metallic target in the aluminium chromium oxide system already mentioned above would be an aluminium/chromium(70/30) at % target.

At least one target which contains at least the second metal (M2) is used for application of the arc vapour deposition method (arc PVD).

If in connection with this application it is stated that a target contains a metal or a plurality of metals, that includes both purely metallic targets and also ceramic targets in which the metal or metals is or are present for example in the form of oxide, nitride, carbide or boride.

Generally almost any metal is suitable for deposition of the mixed crystal layers according to the invention. In an embodiment of the invention the first metal and the second metal are selected from the elements of the subgroups IVa to VIIa of the periodic system, lithium, boron, aluminium and silicon. Preferably however the first metal and the second metal are aluminium and chromium. An aluminium chromium mixed oxide layer within a tool coating has proven to be particularly advantageous. Those coatings enjoy very high hardness and wear resistance.

In a preferred embodiment of the invention two aluminium targets or an aluminium target and a mixed aluminium chromium target are used for the production of aluminium chromium mixed oxide layers, for application of the dual magnetron method or HIPIMS. One or two chromium targets are used for the arc vapour deposition method (arc PVD). Targets intended for the same PVD method are arranged within the PVD apparatus on mutually opposite sides of the substrate holders.

In a further embodiment of the present invention the mixed crystalline layers are deposited in layer thicknesses of 0.2 nm to 10 μm, preferably 5 nm to 1 μm, particularly preferably 10 nm to 100 nm. Excessively great layer thicknesses have the disadvantage that the layers can spall off because of detrimental stress conditions. In addition the deposition rate decreases with increasing layer thickness so that deposition can become uneconomical because of a very low deposition rate.

The mixed crystal oxide layers of the invention can in themselves involve a layer structure which can be produced by virtue of rotation of the substrates upon deposition in the PVD apparatus in dependence on the speed of rotation. In that case the mutually superposed layers can involve different chemical compositions in accordance with the target composition and/or can involve different orientations of the crystals, wherein the crystal system of the mutually superposed layers is the same within a mixed crystal oxide layer. The thickness of the individual layers within a mixed crystal oxide layer can be from 0.1 nm to 1 μm, preferably 2 nm to 500 nm, particularly preferably 3 nm to 50 nm, quite particularly preferably 5 nm to 15 nm.

In a further embodiment of the method according to the invention the substrate for deposition of the mixed crystal layers is made from hard metal, cermet, steel or high-speed steel (HSS). Particularly preferably the substrate is made from hard metal or cermet.

In a further embodiment of the method according to the invention target material with a melting point above 700° C., preferably above 1000° C., particularly preferably above 1500° C., is used for the arc vapour deposition method (arc PVD). The use of a target material with a high melting point in the arc method has the advantage that considerably fewer macroparticles (droplets) are also deposited in comparison with a low-melting target material.

The present invention also includes a cutting tool comprising a substrate and a single-layer or multi-layer coating applied thereto, wherein at least one layer of the multi-layer coating is a mixed crystal layer produced using the method according to one of the preceding claims.

Preferably the at least one mixed crystal layer of the multi-layer coating is an aluminium chromium oxide mixed crystal layer which is present completely or at least as 90% by volume thereof in the alpha phase.

The mixed crystal layer according to the invention has the advantage that it has a particularly high degree of crystallinity and a low proportion of deposited macroparticles (droplets). A particularly high proportion of the thermodynamically stable alpha phase of the mixed crystal is obtained, using the method according to the invention, in the system of the aluminium chromium mixed oxides and in comparable systems of a similar crystal structure. The advantages are a high level of hardness, high wear resistance, high temperature resistance and high temperature cycle resistance.

EXAMPLES

Hard metal substrates were coated in a PVD apparatus in accordance with the present invention (Examples 1 and 2) and conventionally (comparative Examples 1 and 2) by means of dual magnetron sputtering alone (comparative Examples) or in combination with arc vapour deposition (Examples according to the invention) with aluminium chromium mixed oxide layers or aluminium oxide respectively. The Vickers hardness (VH) and the reduced E-module ($EIT/(1-v^2)$) were then determined. The test parameters and results are reproduced in the Tables hereinafter.

It was confirmed by X-ray investigations that the layers of Examples 1 and 2 were single-phase mixed crystal layers of alpha aluminium chromium oxide whereas comparative Example 1 gave only a mixture of gamma aluminum oxide and amorphous aluminium oxide and comparative Example 2 provided a mixture of alpha and gamma phases. All layers were substantially free of macroparticles (droplets).

| Process parameters | Example 1 | Example 2 | Comparative Example 1 | Comparative Example 2 |
|---|---|---|---|---|
| Dual magnetron | Al rectangular targets (81 cm × 16 cm) | Al and AlCr(70/30) at % rectangular targets (81 cm × 16 cm) | Al rectangular targets (81 cm × 16 cm) | AlCr(70/30) at % rectangular targets (81 cm × 16 cm) |
| Arc vapour deposition | 4 Cr round sources (Ø 63 mm) with 75A respectively | 4 Cr round sources (Ø 63 mm) with 75A respectively | | |
| Substrate bias voltage | 120 V (unipolarly pulsed frequency 100 Hz) | 60 V (unipolarly pulsed frequency 100 Hz) | 150 V | 150 V |
| Power (dual magnetron) | 20 kW | 20 kW | 20 kW | 20 kW |
| Argon flow | 180 sccm | 180 sccm | 500 sccm | 500 sccm |
| Oxygen flow | 500 sccm | 500 sccm | 100 sccm | 100 sccm |

| | Example 1 | Example 2 | Comparative Example 1 | Comparative Example 2 |
|---|---|---|---|---|
| Vickers hardness (VH) | 2438 | 2270 | 2101 | 2602 |
| $EIT/(1-v^2)$ | 328 Gpa | 280 Gpa | 315 Gpa | 339 Gpa |

The invention claimed is:

1. A method for depositing single-phase mixed crystal layers of aluminium and chromium oxides on a substrate by means of PVD methods, wherein deposition of the single-phase mixed crystal layer is effected with simultaneous application of i) a cathode sputtering method of dual magnetron sputtering or high power impulse magnetron sputtering and ii) an arc vapour deposition method, and wherein at least one target is used for application of the cathode sputtering method of dual magnetron sputtering or high power impulse magnetron sputtering, which target contains at least aluminium and optionally additionally chromium, and at least one target which contains at least chromium is used for application of the arc vapour deposition method.

2. A method according to claim 1, wherein two aluminium targets or an aluminium target and a mixed aluminium chromium target is used for application of the cathode sputtering method of dual magnetron sputtering or high power impulse magnetron sputtering, and at least one chromium target is used for the arc vapour deposition method.

3. A method according to claim 1, wherein the mixed crystal layers are deposited in layer thicknesses of 0.2 nm to 10 μm.

4. A method according to claim 3, wherein the layer thicknesses is 5 nm to 1 μm.

5. A method according to claim 4, wherein the layer thicknesses is 10 nm to 100 nm.

6. A method according to claim 1, wherein the substrate is made from hard metal, cermet, steel or high speed steel.

7. A method according to claim 1, wherein target material with a melting point above 700° C. is used for the arc vapour deposition method.

8. A method according to claim 7, wherein the melting point of the target material is above 1000° C.

9. A method according to claim 8, wherein the melting point of the target material is above 1500° C.

10. A cutting tool comprising a substrate and a single-layer or multi-layer coating applied thereto, wherein at least one layer of the multi-layer coating is a mixed crystal layer produced using the method according to claim 1.

11. A cutting tool according to claim 10, wherein the at least one mixed crystal layer of the multi-layer coating is an aluminium chromium oxide mixed crystal layer which is present completely or at least as 90% by volume thereof in the alpha phase.

12. A method according to claim 1, wherein the single-phase mixed crystal layers are substantially free of macroparticles.

13. A method for depositing single-phase mixed crystal layers of aluminium and chromium oxides on a substrate, comprising:

depositing the single-phase mixed crystal layer in a PVD process by simultaneous application of i) a cathode sputtering method of dual magnetron sputtering or high power impulse magnetron sputtering and ii) an arc vapour deposition method, wherein the cathode sputtering method of dual magnetron sputtering or high power impulse magnetron sputtering uses at least a first target that contains at least aluminium and optionally additionally chromium, wherein the arc vapour deposition method uses at least a second target that contains at least chromium, and wherein a complete thickness of the single-phase mixed crystal layer is deposited during the simultaneous application of the cathode sputtering method and the arc vapour deposition method.

14. A method according to claim 13, wherein the single-phase mixed crystal layers are substantially free of macroparticles.

* * * * *